(12) United States Patent
Kaneko et al.

(10) Patent No.: US 8,880,375 B2
(45) Date of Patent: Nov. 4, 2014

(54) TEST APPARATUS AND TEST METHOD

(75) Inventors: Kuniyuki Kaneko, Gunma (JP);
Naoyoshi Watanabe, Saitama (JP)

(73) Assignee: Advantest Corporation, Tokyo (JP)

( * ) Notice: Subject to any disclaimer, the term of this patent is extended or adjusted under 35 U.S.C. 154(b) by 918 days.

(21) Appl. No.: 13/026,160

(22) Filed: Feb. 11, 2011

(65) Prior Publication Data
US 2011/0196640 A1     Aug. 11, 2011

Related U.S. Application Data

(63) Continuation of application No. PCT/JP2008/066004, filed on Sep. 4, 2008.

(51) Int. Cl.
    *G06F 19/00*     (2011.01)
    *G11C 29/56*     (2006.01)
    *G11C 16/04*     (2006.01)

(52) U.S. Cl.
    CPC ............... *G11C 29/56* (2013.01); *G11C 16/04* (2013.01)
    USPC ........... 702/108; 702/117; 702/118; 702/119; 702/124; 702/186; 714/700; 714/718; 714/724; 714/738; 714/742; 714/732; 324/73.1; 324/537; 324/763; 324/617

(58) Field of Classification Search
    CPC .. G11C 29/56; G11C 16/04; G01R 31/31908; G01R 31/31926; G01R 31/31905; G01R 31/31813; G01R 31/319
    USPC ................. 702/108, 117, 118, 119, 124, 186; 714/700, 718, 724, 738, 742, 732; 324/73.1, 537, 763, 617
    See application file for complete search history.

(56) References Cited

U.S. PATENT DOCUMENTS 7,213,182 B2 *   5/2007   Kobayashi ..................... 714/724
7,286,950 B2 *   10/2007   Ozora et al. ................. 702/108
(Continued)

FOREIGN PATENT DOCUMENTS

EP     1684082 A1 *   7/2006
EP     1783503 A1 *   5/2007
(Continued)

OTHER PUBLICATIONS

International Search Report (ISR) issued in PCT/JP2008/066004 (parent application) mailed in Dec. 2008 for Examiner consideration, citing U.S. Patent Application Publication No. 1 and Foreign Patent document No. 3 listed above.

(Continued)

*Primary Examiner* — Carol S Tsai

(57) ABSTRACT

Provided is a test apparatus that tests a device under test having a plurality of output terminals. The test apparatus comprises an executing section that executes a test command sequence for testing the device under test; a storage section that stores a plurality of pieces of setting data designating one or more output terminals among the plurality of output terminals; a detecting section that detects whether a value of an output signal from an output terminal designated by one of the pieces of setting data matches an expected value; and a selecting section that selects different pieces of setting data in the storage section when at least two detection commands, which change execution sequencing of the test command sequence according to the detection results of the detecting section, are executed, and supplies the selected pieces of setting data to the detecting section.

7 Claims, 7 Drawing Sheets

(56) References Cited

U.S. PATENT DOCUMENTS

| | | | |
|---|---|---|---|
| 7,359,822 B2* | 4/2008 | Fujiwara et al. | 702/120 |
| 7,500,148 B2* | 3/2009 | Murata | 714/32 |
| 7,574,633 B2* | 8/2009 | Sato et al. | 714/700 |
| 7,774,669 B2* | 8/2010 | Romero et al. | 714/742 |
| 2004/0122620 A1* | 6/2004 | Doi et al. | 702/182 |
| 2005/0278599 A1 | 12/2005 | Fujiwara et al. | |
| 2006/0036389 A1* | 2/2006 | Ozora et al. | 702/108 |
| 2006/0161829 A1* | 7/2006 | Kobayashi | 714/738 |
| 2006/0190794 A1* | 8/2006 | Murata | 714/742 |
| 2008/0012576 A1* | 1/2008 | Sato et al. | 324/617 |

FOREIGN PATENT DOCUMENTS

| | | | |
|---|---|---|---|
| EP | 1873538 A1 * | 1/2008 | |
| JP | H11-64454 A | 3/1999 | |
| JP | 2000-40389 A | 2/2000 | |
| KR | 10-1999-0006955 A | 1/1999 | |
| KR | 10-2007-0020161 A | 2/2007 | |
| WO | 2004/070404 A1 | 8/2004 | |

OTHER PUBLICATIONS

Written Opinion (PCT/ISA/237) issued in PCT/JP2008/066004 (parent application) mailed in Dec. 2008.

Korean Office Action dated Apr. 27, 2012, in a counterpart Korean patent application No. 10-2011-7003479. (This Korean OA cites Foreign Patent document Nos. 1-2.).

* cited by examiner

| MATCH FLAG VALUE | TARGET FLAG VALUE | OUTPUT SIGNAL VALUE | EXPECTED VALUE | PIN MATCH SIGNAL VALUE |
|---|---|---|---|---|
| 0 | X | X | X | 0 |
| 1 | 0 | X | X | 1 |
| 1 | 1 | O(L) | O(L) | 1 |
| 1 | 1 | O(L) | 1(H) | 0 |
| 1 | 1 | 1(H) | O(L) | 0 |
| 1 | 1 | 1(H) | 1(H) | 1 |

FIG. 4

| ADDRESS | COMMAND | OPERAND | PATTERN (EXPECTED VALUE) |
|---|---|---|---|
| ⋮ | | | |
| 0001 | NOP | | |
| 0002 | NOP | | |
| 0003 | NOP | | |
| 0004 | FLGLi | 1 | P1=H、P2=X、P3=X |
| 0005 | NOP | | |
| 0006 | FLGLi | 2 | P1=X、P2=H、P3=X |
| 0007 | NOP | | |
| 0008 | FLGLi | 3 | P1=X、P2=X、P3=H |
| 0009 | NOP | | |
| 0010 | JMP | | |
| ⋮ | | | |
| 1001 | XXX | | |
| 1002 | XXX | | |
| 1003 | XXX | | |
| 1004 | ⋮ | | |
| 2001 | XXX | | |
| 2002 | XXX | | |
| 2003 | XXX | | |
| 2004 | ⋮ | | |
| 3001 | XXX | | |
| 3002 | XXX | | |
| 3003 | XXX | | |
| 3004 | ⋮ | | |

FIG. 7

TEST APPARATUS AND TEST METHOD

BACKGROUND

1. Technical Field

The present invention relates to a test apparatus and a test method for testing a device under test.

2. Related Art

A test apparatus that tests a device under test, such as a semiconductor, supplies the device under test with a test signal having a prescribed test pattern and detects the value of a signal output from the device under test in response to the test signal. The test apparatus judges pass/fail of the device under test by comparing the detected value of the signal to the expected value.

Such a test apparatus includes a pattern generator. The pattern generator sequentially executes test commands included in a test command sequence, which is sequence data. The pattern generator sequentially outputs the test pattern corresponding to the executed test commands.

The pattern generator can execute a test command known as a "match command," as shown in Patent Documents 1 and 2, for example. The match command is a branch command for detecting whether the value of the output signal from the device under test matches the expected value, and branching into different commands depending on whether the value of the output signal matches the expected value.

By executing a test command sequence that includes a match command, the test apparatus can perform the operations described below, for example.

A device under test including a PLL (Phase Locked Loop) outputs a lock signal when the PLL is in a stable state. A test apparatus testing such a device under test can use the match command to execute a process for exiting a loop on a condition that the value of the lock signal matches a prescribed value. As a result, the test apparatus can perform a function test after the PLL has achieved stable operation following the power supply being turned on.

A NAND flash memory outputs a ready/busy signal indicating whether a deleting operation or a recording operation is being performed. When such a NAND flash memory performs the deleting operation or recording operation, a test apparatus that tests the NAND flash memory can perform a subsequent test after detecting via the match command that the value of the ready/busy signal matches the expected value. As a result, the test apparatus can perform the subsequent test after it is ensured that the deleting operation or recording operation of the NAND flash memory is complete.

Patent Document 1: Japanese Patent Application Publication No. 2000-40389
Patent Document 2: Japanese Patent Application Publication No. H11-64454

When executing the match command, the test apparatus must allocate hardware in advance for detecting whether the value of the output signal matches the expected value, to each terminal that is a target of the detection by the match command. Accordingly, during execution of the test sequence, the test apparatus cannot dynamically change the terminals that are targets of the detection by the match command.

Furthermore, when testing a device under test in which three or more states are represented by a plurality of output signal values, the test apparatus should be able to branch into different commands for each of the three or more states. However, the test apparatus cannot dynamically change the terminals that are targets of the detection by the match command during execution of the test sequence, and it is extremely difficult to detect the three or more states expressed by the plurality of output signals using hardware. As a result, the test apparatus cannot change among different commands corresponding to three or more states.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, provided is a test apparatus that tests a device under test having a plurality of output terminals. The test apparatus comprises an executing section that executes a test command sequence for testing the device under test; a storage section that stores a plurality of pieces of setting data designating one or more output terminals among the plurality of output terminals; a detecting section that detects whether a value of an output signal from an output terminal designated by one of the pieces of setting data matches an expected value; and a selecting section that selects different pieces of setting data in the storage section when at least two detection commands, which change execution sequencing of the test command sequence according to the detection results of the detecting section, are executed, and supplies the selected pieces of setting data to the detecting section. Also provided is a test method relating to the test apparatus.

The summary clause does not necessarily describe all necessary features of the embodiments of the present invention. The present invention may also be a sub-combination of the features described above.

BRIEF DESCRIPTION OF THE DRAWINGS

FIG. 4 shows a relationship between a signal input to a terminal-associated detecting section 46 and a signal output from the terminal-associated detecting section 46.

FIG. 7 shows an exemplary test command sequence for executing the sequence shown in FIG. 5.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
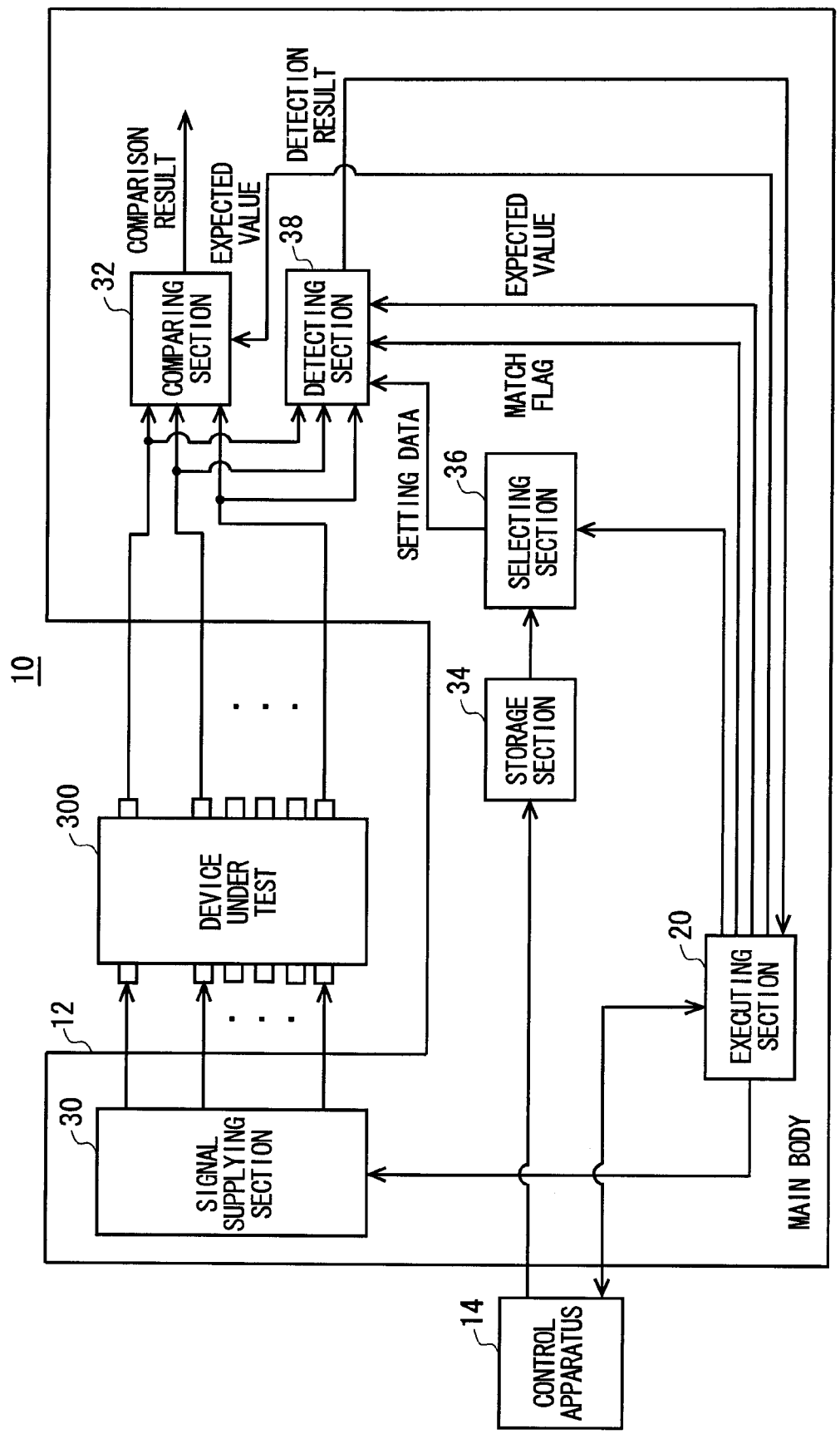
FIG. 1 shows a configuration of a test apparatus 10 according to an embodiment of the present invention, along with a device under test 300.

FIG. 1 shows a configuration of a test apparatus 10 according to an embodiment of the present invention, along with a device under test 300. The test apparatus 10 tests a device under test 300 that includes a plurality of output terminals.

The test apparatus 10 includes a main body 12 and a control apparatus 14. The main body 12 exchanges signals with the device under test 300. The control apparatus 14 controls operation of the main body 12 by executing a control program for controlling the device under test 300 with the test apparatus 10.

The main body 12 includes an executing section 20, a signal supplying section 30, a comparing section 32, a storage section 34, a selecting section 36, and a detecting section 38.

The executing section 20 executes a test command sequence for testing the device under test 300. More specifically, the executing section 20 sequentially performs each test command in the test command sequence. The executing section 20 generates patterns, such as a test pattern and an expected value pattern, stored in association with the executed test commands. As a result, the executing section 20 can generate a test pattern, which indicates a pattern of the test signal to be supplied to the device under test 300, and an expected value pattern of the output signal to be output from the device under test 300. Prior to executing the test command sequence, the executing section 20 receives the test command sequence from the control apparatus 14.

The signal supplying section 30 generates the test signal to have a waveform corresponding to the test pattern generated by the executing section 20, and supplies this test signal to the device under test 300. As a result, the device under test 300 operates according to the received test signal.

The comparing section 32 receives the output signal output by the device under test 300 in response to the test signal supplied thereto. The comparing section 32 compares the value of the received output signal to the expected value generated by the executing section 20, and outputs the comparison result.

The storage section 34 stores a plurality of pieces of setting data designating at least one output terminal among the output terminals of the device under test 300 outputting an output signal. In the present embodiment, the storage section 34 stores a plurality of pieces of setting data respectively associated with unique identification information. Prior to the executing section 20 executing the test command sequence, the storage section 34 receives the pieces of setting data from the control apparatus 14 and stores the received pieces of setting data.

The selecting section 36 selects pieces of setting data designated by the executing section 20, from among the pieces of setting data stored in the storage section 34, and supplies the selected pieces of setting data to the detecting section 38. For example, the selecting section 36 may receive identification information included in a detection command, which is explained further below, executed by the executing section 20, select from the storage section 34 the setting data corresponding to the received identification information, and supply the setting data to the detecting section 38.

The detecting section 38 detects whether the value of the output signal from the output terminal designated by the received setting data matches the expected value generated by the executing section 20. The detecting section 38 supplies the detection result to the executing section 20.

Figure 2:
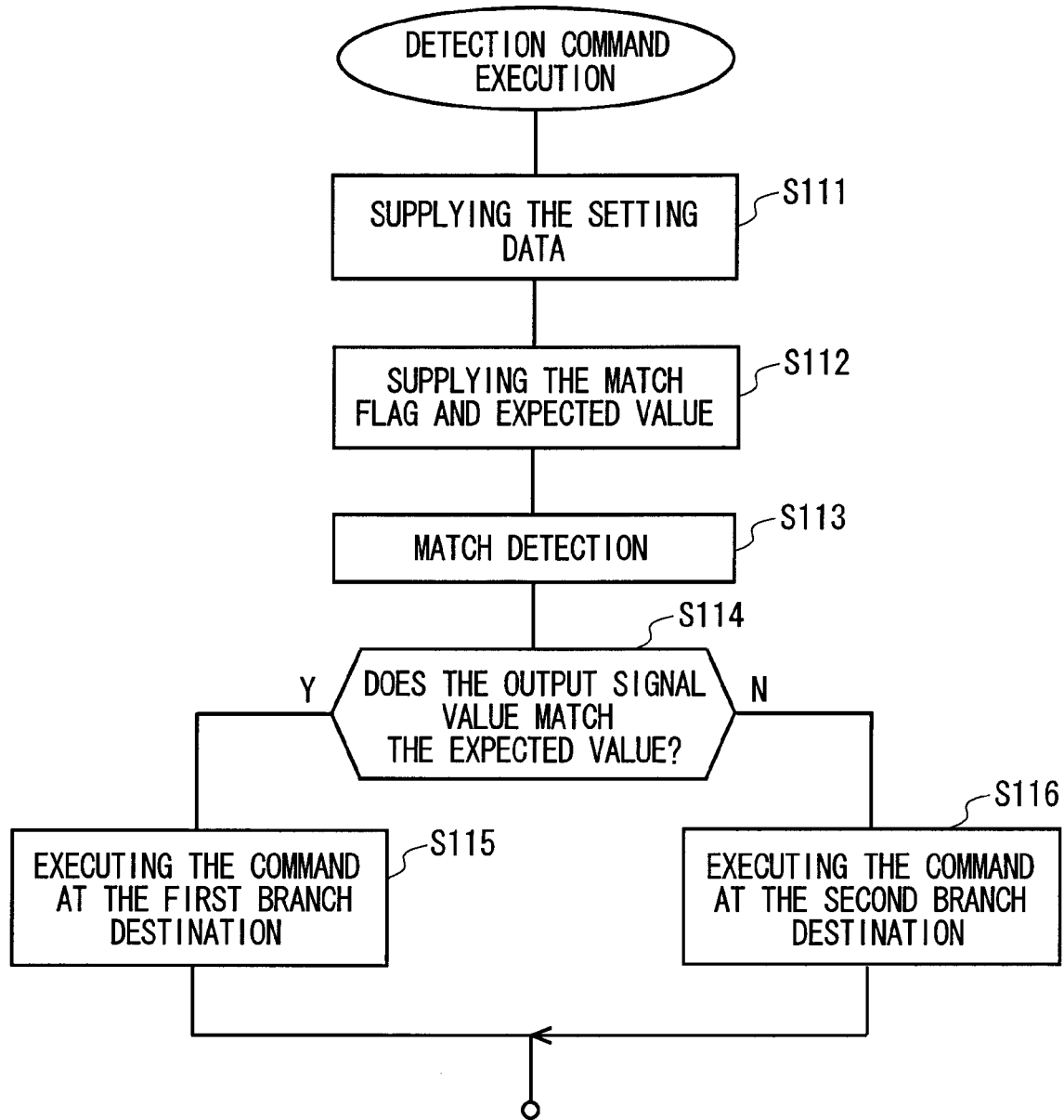
FIG. 2 shows a process flow of the detection command execution by the test apparatus 10 according to the present embodiment.

FIG. 2 shows a process flow of the detection command execution by the test apparatus 10 according to the present embodiment. Prior to the executing section 20 executing the test command sequence, the control apparatus 14 writes the test command sequence recorded in the test program, for example, to the executing section 20. Furthermore, prior to the executing section 20 executing the test command sequence, the control apparatus 14 writes the setting data recorded in the control program, for example, to the storage section 34. When instructions are received to begin testing, the executing section 20 sequentially executes each test command included in the test command sequence, beginning with the test command at the leading address, for example.

The test command sequence executed by the executing section 20 may include the detection command. The detection command changes the execution sequencing of the test command sequence, according to the detection results by the detecting section 38. In other words, the detection command causes the detecting section 38 to detect whether the value of the output signal of the device under test 300 matches the expected value, and switches the jump destination of the command to be performed next according to the detection result of the detecting section 38. For example, the detection command may branch to a command earlier than the detection command on a condition that the value of the output signal does not match the expected value, and branch to a command later than the detection command, such as the next command, on a condition that the value of the output signal does match the expected value. As a result, the detection command can cause a loop process that is repeated until the value of the output signal matches the expected value.

Furthermore, the detection command includes information that designates one piece of setting data to be supplied to the detecting section 38 from among the pieces of setting data stored in the storage section 34. In the present embodiment, the detection command includes, as an operand, identification information of the setting data to be sent to the detecting section 38.

When this detection command is executed, the test apparatus 10 performs the process flow shown in FIG. 2. First, when a detection command is executed, the selecting section 36 selects one piece of setting data designated by the detection command from among the pieces of setting data stored in advance in the storage section 34, and supplies the selected piece of setting data to the selecting section 36 (S111). In the present embodiment, the selecting section 36 receives the identification information included in the operand of the detection command form the executing section 20, selects the piece of setting data corresponding to the received identification information from the storage section 34, and supplies the selected piece of setting data to the detecting section 38. In this way, when at least two detection commands are executed, the selecting section 36 can select different pieces of setting data from the storage section 34 and supply the selected pieces of setting data to the detecting section 38.

Instead of being included in the operand of the detection command, the identification information may be included in a portion of a pattern associated with the detection command. In this case, the executing section 20 extracts the identification information from the portion of the pattern associated with the detection command, and supplies the extracted identification information to the selecting section 36.

For each execution of a detection command, the executing section 20 supplies the detecting section 38 with a match flag indicating execution of a detection command and an expected value of the output signal to be detected (S112). On a condition that a match flag is provided, e.g. on a condition that the value of the match flag is 1, the detecting section 38 detects whether the value of the output signal from each output terminal designated by the setting data supplied thereto matches the corresponding expected value (S113).

On a condition that all of the values of the output signals from the output terminals designated by the setting data match the corresponding expected values (the "Yes" of S114), following this detection command, the executing section 20 performs the test command at a first branch destination designated by the detection command (S115). On the other hand, on a condition that at least one of the values of the output signals from the output terminals designated by the setting data does not match the corresponding expected value (the "No" of S114), following this detection command, the executing section 20 performs the test command at a second branch destination, which is different from the first branch destination, designated by the detection command (S116).

In the manner described above, the selecting section 36 selects one piece of setting data from among the pieces of setting data stored in advance in the storage section 34 and supplies the selected piece of setting data to the detecting section 38, for each execution of a detection command by the executing section 20. The detecting section 38 detects whether the value of the output signal output from the output terminal designated by the received piece of setting data matches the expected value. As a result, for each execution of a detection command, the test apparatus 10 can change the output terminal that is the target of the detection concerning whether the output signal value matches the expected value.

Figure 3:
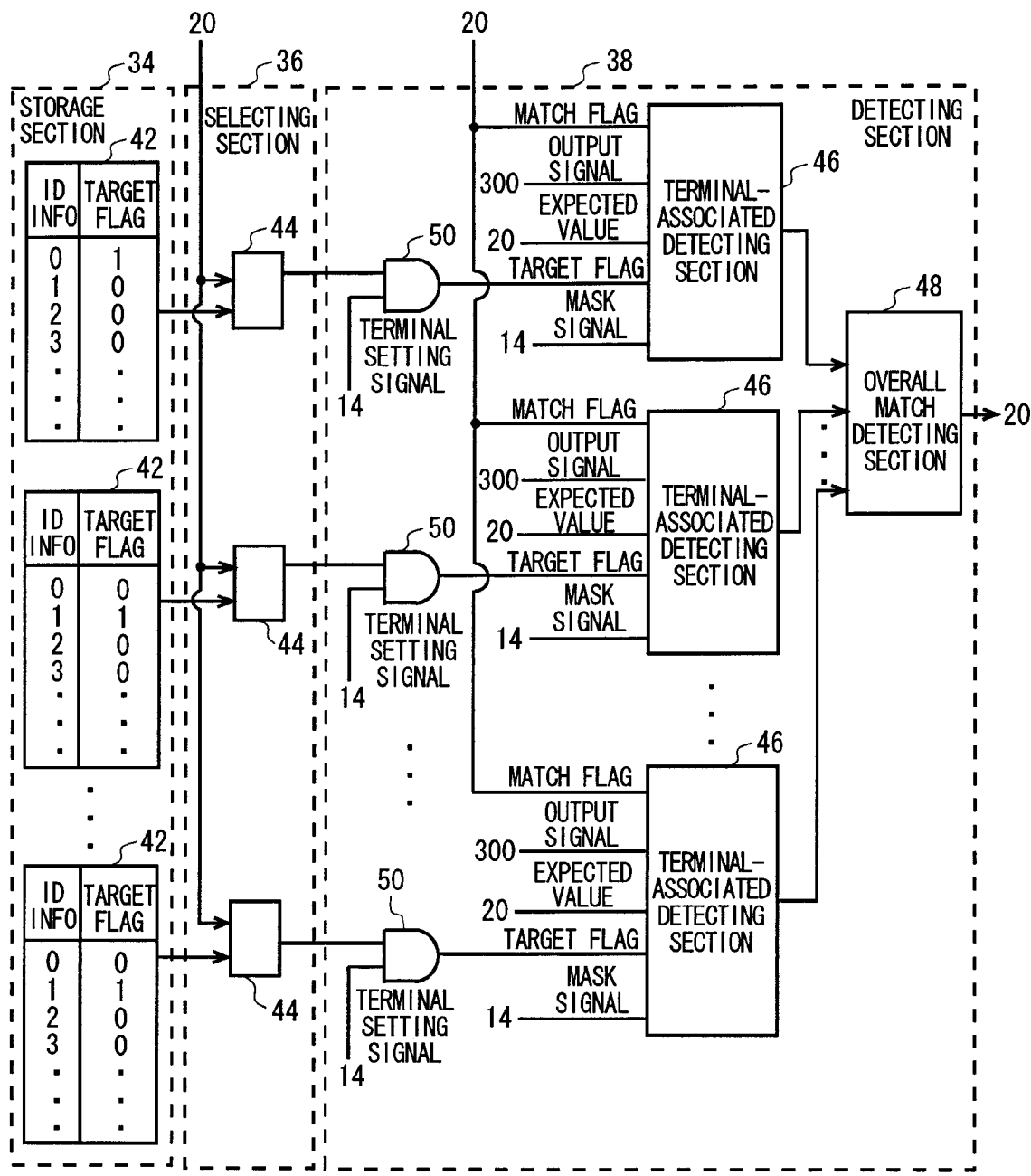
FIG. 3 shows exemplary configurations of the storage section 34, the selecting section 36, and the detecting section 38.

FIG. 3 shows exemplary configurations of the storage section 34, the selecting section 36, and the detecting section 38. FIG. 4 shows a relationship between signals input to a terminal-associated detecting section 46 and a signal output from the terminal-associated detecting section 46.

The storage section 34 may include a plurality of terminal-associated storage sections 42. The selecting section 36 may include a plurality of terminal-associated selecting sections 44. The detecting section 38 may include a plurality of terminal-associated detecting sections 46, an overall match detecting section 48, and a plurality of target terminal setting sections 50.

Each terminal-associated storage section 42 is provided to correspond to an output terminal of the device under test 300. Each terminal-associated storage section 42 stores, for each piece of identification information, a target flag indicating whether the corresponding output terminal is a target for detection by the detecting section 38. In the present embodiment, a target flag indicating 1 when the output terminal is a detection target and indicating 0 when the output terminal is not a detection target is written to each terminal-associated storage section 42.

Each terminal-associated selecting section 44 is provided to correspond to an output terminal of the device under test 300. When the executing section 20 executes a detection command, each terminal-associated selecting section 44 receives from the executing section 20 the value of the identification information included in the detection command. Each terminal-associated selecting section 44 selects the target flag corresponding to the received identification information value and stored in the corresponding terminal-associated storage section 42, and supplies the corresponding terminal-associated detecting section 46 in the detecting section 38 with the selected target flag.

Each terminal-associated detecting section 46 is provided to correspond to an output terminal of the device under test 300. Each terminal-associated detecting section 46 receives a match flag from the executing section 20. Furthermore, each terminal-associated detecting section 46 receives the output signal from the corresponding output terminal of the device under test 300, receives from the executing section 20 the expected value of the output signal output from the corresponding output terminal, and receives the target flag from the corresponding terminal-associated selecting section 44.

Each terminal-associated detecting section 46 outputs a pin match signal, based on the received signals, indicating that the output signal from the corresponding output terminal matches the expected value. More specifically, each terminal-associated detecting section 46 outputs the pin match signal on a condition that the match flag is received, a target flag indicating that the corresponding output terminal is a detection target is received from the corresponding terminal-associated storage section 42, and the value of the output signal from the output terminal matches the expected value. Furthermore, each terminal-associated detecting section 46 outputs the pin match signal on a condition that the match flag is received and a target flag indicating that the corresponding output terminal is not a detection target is received from the corresponding terminal-associated storage section 42.

Each terminal-associated detecting section 46 does not output the pin match signal if the match flag is not received. Furthermore, each terminal-associated detecting section 46 does not output the pin match signal if the value of the output signal from the corresponding output terminal does not match the expected value, even if the match flag and target flag are received.

In the present embodiment, each terminal-associated detecting section 46 outputs the pin match signal as shown in FIG. 4. Specifically, each terminal-associated detecting section 46 outputs a pin match signal with a value of 0 when the match flag value is 0, regardless of the target flag value, the output signal value, and the expected value. Furthermore, each terminal-associated detecting section 46 outputs the pin match signal with a value of 1 when the match flag value is 1 and the target flag value is 0, regardless of the output signal value and the expected value.

When the match flag value is 1 and the target flag value is 1, each terminal-associated detecting section 46 outputs the pin match signal with a value of 1 on a condition that the output signal value matches the expected value. When the match flag value is 1 and the target flag value is 1, each terminal-associated detecting section 46 outputs the pin match signal with a value of 0 on a condition that the output signal value does not match the expected value.

In addition to the above, each terminal-associated detecting section 46 may further receive a mask signal indicating that the corresponding output terminal will not be a detection target. For example, each terminal-associated detecting section 46 may receive, as the mask signal, a value written by the control apparatus 14 to a prescribed register. On a condition that the mask signal is received, the terminal-associated detecting section 46 outputs the pin match signal regardless of the match flag, the output signal value, the expected value, and the target flag. As a result, the control apparatus 14 can set the terminal-associated detecting sections 46 that are not connected to the device under test 300, for example, to output the pin match signal regardless of the target flags.

The overall match detecting section 48 outputs to the executing section 20 an overall match signal, which indicates that the output signals from the output terminals serving as detection targets match the expected values, in response to pin match signals being output from all of the terminal-associated detecting sections 46. In the present embodiment, on a condition that every pin match signal output by the terminal-associated detecting sections 46 has a value of 1, the overall match detecting section 48 outputs the overall match signal with a value of 1 to the executing section 20. On a condition that there is a pin match signal with a value of 0 among the pin match signals output from the terminal-associated detecting sections 46, the overall match detecting section 48 outputs the overall match signal with a value of 0 to the executing section 20. Upon receiving this overall match signal, the executing section 20 changes the execution sequencing of the test commands according to the value of the overall match signal.

Each target terminal setting section 50 receives a terminal setting signal that indicates whether the corresponding output terminal is a target for detection according to the detection command. For example, each target terminal setting section 50 may receive, as the terminal setting signal, a value written to a prescribed register or the like by the control apparatus 14. On a condition that the terminal setting signal is supplied thereto, the target terminal setting section 50 supplies the target flag to the corresponding terminal-associated detecting section 46. On a condition that the terminal setting signal is not supplied thereto, the target terminal setting section 50 does not supply the target flag to the corresponding terminal-associated detecting section 46, i.e. the target terminal setting section 50 supplies the corresponding terminal-associated detecting section 46 with a target flag having a value of 0. As a result, prior to the executing section 20 executing the test command sequence, the control apparatus 14 can set the terminal-associated detecting sections 46 corresponding to output terminals that are not detection targets to output the pin match signal regardless of the target flag value, based on a list of output terminals that could be detection targets recorded in the control program.

The storage section 34 and selecting section 36 described above can select one piece of setting data from among the pieces of setting data stored in the storage section 34 in advance, for each detection command executed by the executing section 20, and supply the detecting section 38 with the selected piece of setting data. The detecting section 38 describes above can detect a match between the expected value and the output signal from the output terminal designated by the setting data supplied thereto.

Prior to the executing section 20 executing the test command sequence, the control apparatus 14 may write, to the terminal-associated storage section 42 of every output terminal, a target flag indicating that the output terminal is a detection target, in association with the value of at least one piece of identification information. For example, the control apparatus 14 may write a target flag with a value, e.g. a value of 1 in the present embodiment, that sets the output terminal to be a detection target, in association with the leading piece of identification information in each terminal-associated storage section 42.

As a result, when a detection command designates this identification information, i.e. the leading piece of identification information, the detecting section 38 can detect whether the output signal value matches the expected value for only the terminals supplied with the terminal setting signal. In other words, the detecting section 38 can detect whether the output signal value matches the expected value for output terminals specified by the control apparatus 14 prior to the execution of the test command sequence.

Figure 5:
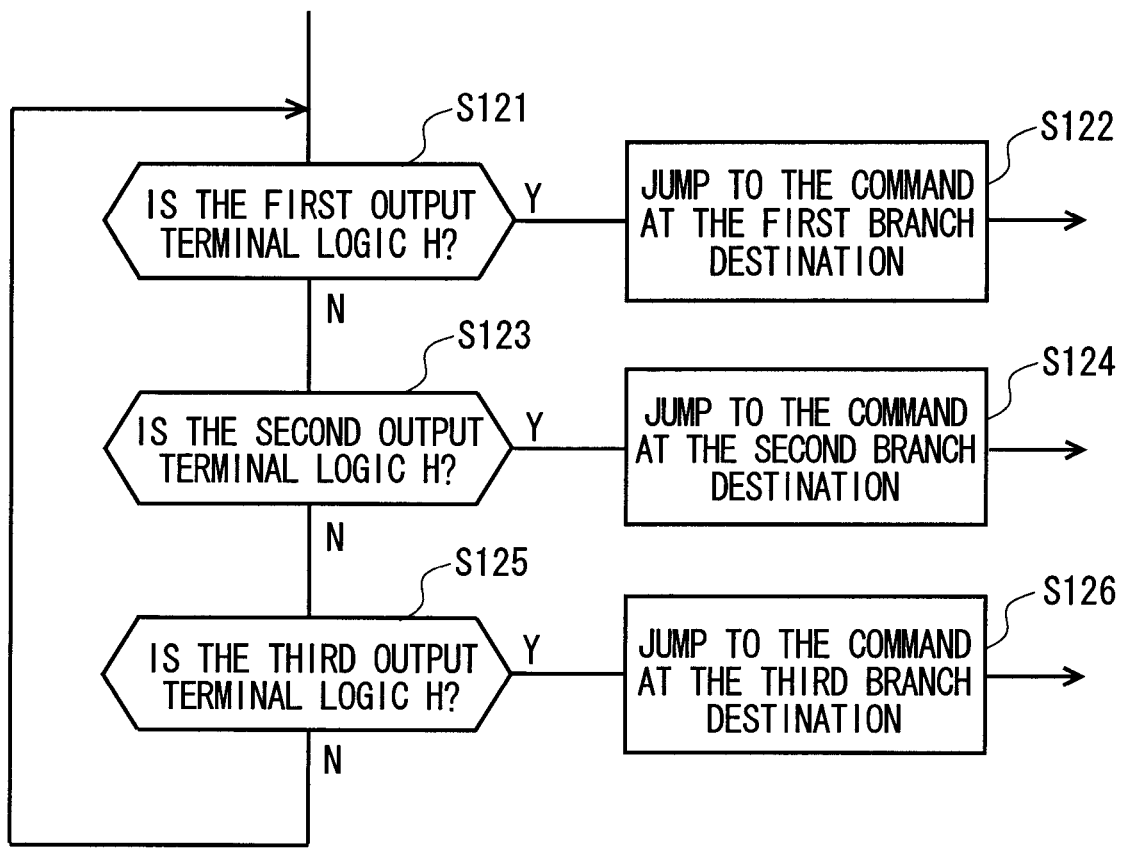
FIG. 5 is a flow chart showing an exemplary sequence executed by the executing section 20.
Figure 6A:
FIG. 6A shows exemplary target flags, stored in the terminal-associated storage section 42 corresponding to a first output terminal, for executing the sequence shown in FIG. 5.
Figure 6B:
FIG. 6B shows exemplary target flags, stored in the terminal-associated storage section 42 corresponding to a second output terminal, for executing the sequence shown in FIG. 5.
Figure 6C:
FIG. 6C shows exemplary target flags, stored in the terminal-associated storage section 42 corresponding to a third output terminal, for executing the sequence shown in FIG. 5.

FIG. 5 is a flow chart showing an exemplary sequence executed by the executing section 20. FIGS. 6A, 6B, and 6C show exemplary target flags stored in the terminal-associated storage sections 42 for executing the sequence shown in FIG. 5. FIG. 7 shows an exemplary test command sequence for executing the sequence shown in FIG. 5.

The executing section 20 can execute the sequence shown by the flow in FIG. 5, for example. The sequence shown by the flow of FIG. 5 jumps to a first branch destination (S122) when a first output terminal is logic H (the "Yes" of S121), jumps to a second branch destination (S124) when a second output terminal is logic H (the "Yes" of S123), and jumps to a third branch destination (S126) when a third output terminal is logic H (the "Yes" of S125). Furthermore, the sequence of FIG. 5 maintains a loop process when all of the first to third output terminals are logic L (The "No" of S121, S123, and S125).

When executing such a sequence, prior to the executing section 20 executing the test command sequence, the control apparatus 14 writes the target flag shown in FIG. 6A, for example, to the terminal-associated storage section 42 corresponding to the first output terminal. In other words, the control apparatus 14 writes a target flag that has a value of 1 for identification information 1 and a value of 0 for identification information 2 and identification information 3.

Prior to the executing section 20 executing the test command sequence, the control apparatus 14 writes the target flag shown in FIG. 6B, for example, to the terminal-associated storage section 42 corresponding to the second output terminal. In other words, the control apparatus 14 writes a target flag that has a value of 1 for identification information 2 and a value of 0 for identification information 1 and identification information 3.

Prior to the executing section 20 executing the test command sequence, the control apparatus 14 writes the target flag shown in FIG. 6B, for example, to the terminal-associated storage section 42 corresponding to the third output terminal. In other words, the control apparatus 14 writes a target flag that has a value of 1 for identification information 3 and a value of 0 for identification information 1 and identification information 2.

Furthermore, when executing the above sequence, the control apparatus 14 causes the executing section 20 to execute a test command sequence such as shown in FIG. 7. In the test command sequence of FIG. 7, the NOP commands are commands for moving the processing to the command at the next address, and the JMP commands are commands for jumping forward to a command at a designated address.

The FLGLi commands are examples of detection commands. More specifically, the FLGLi commands include identification information in the operands thereof and cause the detecting section 38 to detect whether the expected value matches the output signal value of the output terminal designated by the identification information. The FLGLi commands cause a jump to a designated address i when these values match, and move the processing to the command at the next address when these values do not match.

In the test command sequence shown in FIG. 7, a first FLGLi command at address 0004, a second FLGLi command at address 0006, and a third FLGLi command at address 0008 are arranged in a loop from address 0003 to address 0010 formed by a JMP command. The first FLGLi command at address 0004 detects wither the value of the first output terminal P1 matches logic H, and if the value matches, exits the loop by jumping to address 1001. The second FLGLi command at address 0006 detects wither the value of the second output terminal P2 matches logic H, and if the value matches, exits the loop by jumping to address 2001. The third FLGLi command at address 0008 detects wither the value of the third output terminal P3 matches logic H, and if the value matches, exits the loop by jumping to address 3001.

The test apparatus 10 of the present embodiment can dynamically change the output terminals for which a match or mismatch is detected, during execution of the test sequence. As a result, the test apparatus 10 can jump to different commands in a test command sequence for each of three or more states of a plurality of output signals from a device under test 300.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test having a plurality of output terminals, the test apparatus comprising:
    an executing section that executes a test command sequence for testing the device under test;
    a storage section that stores a plurality of pieces of setting data designating one or more output terminals among the plurality of output terminals;
    a detecting section that detects whether a value of an output signal from an output terminal designated by one of the pieces of setting data matches an unexpected value; and
    a selecting section that selects different pieces of setting data in the storage section when at least two detection commands, which change execution sequencing of the test command sequence according to detection results of the detecting section, are executed, and supplies the selected pieces of setting data to the detecting section,
    wherein the executing section executes detection commands that include, as operands, identification information for pieces of setting data to be supplied to the detecting section, and for each detection command execution, the selecting section selects from the storage section a piece of setting data corresponding to the identification information included in the detection command, and supplies the selected piece of setting data to the detecting section.

2. The test apparatus according to claim 1, wherein the storage section includes a plurality of terminal-associated storage sections that correspond respectively to the output terminals and that each store, for each value of the identification information, a target flag that indicates whether the corresponding output terminal is to target for the detection by the detecting section.

3. The test apparatus according to claim 2, wherein the detecting section includes: a plurality of terminal-associated detecting sections that correspond respectively to the output terminals and that each output a pin match signal indicating that the output signal from the corresponding output terminal matches the expected value, on a condition that (i) a target flag indicating that the corresponding output terminal is not a target of the detection is received from the corresponding terminal-associated storage section or (ii) target flag, indicating that the corresponding output terminal is a target of the detection is received from the corresponding terminal-associated storage section and the value of the output signal from the corresponding output terminal matches the expected value; and an overall match detecting section that outputs an overall match signal indicating that the output signals from the output terminals that are targets for the detection match the expected values, in response to the pin match signals being output from all of the terminal-associated detecting sections, and the executing section changes the execution sequencing, of the test command sequence according to the value of the overall match signal.

4. The test apparatus according to claim 3, further comprising a control apparatus that executes a control program for controlling testing, of the device under test by the test apparatus, wherein prior to the executing section executing the test command sequence, the control apparatus writes to the storage section values of the pieces of setting data written in the control program.

5. The test apparatus according to claim 4, wherein prior to the executing, section executing the test command sequence, the control apparatus sets the terminal-associated detecting sections corresponding to the output terminals that are not targets of the detection to output the pin match signals regardless of values of the target flags, based on a list of the output terminals that could be targets of the detection recorded in the control program.

6. The test apparatus according to claim 4, wherein prior to the executing section executing the test command sequence, the control apparatus writes, to the terminal-associated storage sections of all of the output terminals, target flags that each indicate that the corresponding output terminal is a target for the detection, in association with a value of at least one piece of the identification information.

7. A test method performed by a test apparatus that tests a device under test having a plurality of output terminals, wherein the test apparatus includes: an executing section that executes a test command sequence for testing the device under test; a storage section that stores a plurality of pieces of setting data designating one or more output terminals among the plurality of output terminals; and a detecting section that detects whether a value of an output signal from an output terminal designated by one of the pieces of setting data matches an expected value, and the test method comprises:
    executing detection commands that change execution sequencing of the test command sequence according to detection results of the detecting section, and include, as operands, identification information for pieces of setting data to be supplied to the detecting section;
    selecting from the storage section, for each detection command execution, a piece of setting data corresponding to the identification information included in the detection command, such that different pieces of setting data in the storage section are selected when at least two detection commands are executed; and
    supplying the selected pieces of setting data to the detecting section.

* * * * *